(12) United States Patent
Kim

(10) Patent No.: US 7,646,048 B2
(45) Date of Patent: Jan. 12, 2010

(54) CMOS IMAGE SENSOR

(75) Inventor: Bum Sik Kim, Suwon (KR)

(73) Assignee: Dongbu Electronics, Inc., Seoul (KR)

( * ) Notice: Subject to any disclaimer, the term of this patent is extended or adjusted under 35 U.S.C. 154(b) by 525 days.

(21) Appl. No.: 11/319,592

(22) Filed: Dec. 29, 2005

(65) Prior Publication Data
US 2006/0145210 A1    Jul. 6, 2006

(30) Foreign Application Priority Data
Dec. 30, 2004   (KR) ............... 10-2004-0117226

(51) Int. Cl.
*H01L 31/06* (2006.01)
(52) U.S. Cl. ............... 257/292; 257/462; 257/E25.032; 257/E27.132; 257/E27.133
(58) Field of Classification Search ............. 257/159, 257/292, 293, 462
See application file for complete search history.

(56) References Cited
U.S. PATENT DOCUMENTS
5,869,857 A * 2/1999 Chen .................. 257/292
6,521,926 B1 * 2/2003 Sasaki ................. 257/292
7,229,878 B2 * 6/2007 Jeon ................... 438/246
2004/0217262 A1 * 11/2004 Lee ................... 250/208.1
2005/0064665 A1 * 3/2005 Han ................... 438/286
2006/0108618 A1 * 5/2006 Ahn et al. .............. 257/292

FOREIGN PATENT DOCUMENTS
KR   10-2001-0061385 A   7/2001

* cited by examiner

*Primary Examiner*—Kenneth A Parker
*Assistant Examiner*—Jose R Diaz
(74) *Attorney, Agent, or Firm*—McKenna Long & Aldridge LLP

(57) ABSTRACT

A CMOS image sensor includes a photo-transistor capable of performing photo-sensing and active amplification. The photo-transistor is installed to improve low illustration characteristics while maintaining an existing pixel operation. The CMOS image sensor also includes a reset transistor connected to the photo-transistor and adapted to perform a reset function, a drive transistor for acting as a source follower buffer amplifier in response to an output signal from the photo-transistor, and a switching transistor connected to the drive transistor and adapted to perform an addressing function.

6 Claims, 4 Drawing Sheets

CMOS IMAGE SENSOR

This application claims the benefit of Korean Patent Application No. 10-2004-0117226, filed on Dec. 30, 2004, which is hereby incorporated by reference for all purposes as if fully set forth herein.

BACKGROUND OF THE INVENTION

1. Field of the Invention

The present invention relates to a semiconductor device, and more particularly, to a CMOS image sensor wherein a photo-transistor capable of performing photo-sensing and active amplification is installed to improve low illumination characteristics while maintaining an existing pixel operation.

2. Discussion of the Related Art

Generally, image sensors are semiconductor devices which convert optical images into electrical signals, and may be roughly classified into charge coupled device (CCD) image sensors and complementary metal oxide silicon (CMOS) image sensors.

However, in a CCD image sensor, a driving system is complex, a large amount of power is consumed and a multi-step photo-process is required, resulting in a complex manufacturing process. Further, it is difficult to integrate a controller, a signal processor, an analog/digital (A/D) converter, etc. in one CCD chip. Thus, obstacles to miniaturization of a product exist. Recently, CMOS image sensors have received attention as the next generation technology for overcoming the disadvantages of CCD image sensors.

The CMOS image sensor is based on a CMOS technology which employs a controller, a signal processor, etc. as peripheral circuits. In the CMOS image sensor based on the CMOS technology, a number of MOS transistors corresponding to a number of unit pixels are formed on a semiconductor substrate. A switching system is adopted to sequentially detect outputs of the respective unit pixels through the MOS transistors. Because CMOS technology is employed in the CMOS image sensor, a small amount of power is consumed and a small number of photo-process steps are performed, resulting in a simplified manufacturing process. Furthermore, it is possible to integrate the controller, signal processor, A/D converter, etc. in a CMOS image sensor chip, thereby facilitating miniaturization of a product.

A related art CMOS image sensor will be described with reference to FIG. 1, which is a circuit diagram of a unit pixel of a related art CMOS image sensor having four transistors.

As shown in FIG. 1, a related art CMOS image sensor comprises a photo-sensing device 100, for example, a photodiode, for generating photo-charges and a transfer transistor 101 for receiving a $\Phi_{Tx}$ signal at its gate and transferring the photo-charges generated by the photo-sensing device 100 to a floating diffusion region FD 102 in response to the received $\Phi_{Tx}$ signal. The related art CMOS image sensor also includes a reset transistor 103 for receiving an $\Phi_{Rs}$ signal at its gate and for, in response to the received $\Phi_{Rs}$ signal, setting the potential $PV_{RS}$ of the floating diffusion region FD 102 to a desired value or discharging charges stored in the floating diffusion region FD 102 to reset the floating diffusion region FD 102. The related art CMOS image sensor also includes a drive transistor 104 for acting as a source follower buffer amplifier in response to a signal inputted to its gate, and a select transistor 105 for performing an addressing operation in response to a signal $\Phi_{SEL}$ inputted to its gate. A voltage $V_{DL}$ is applied.

However, in the related art CMOS image sensor, when a small amount of light is incident on the photodiode, which acts to convert an optical signal into an electrical signal, a very small amount of charges may be stored in the photodiode. Thus, it may not be possible to make a distinction between an output signal and noise.

In order to overcome the above problem, a scheme has been proposed which activates the unit pixel of the CMOS image sensor, as shown in FIGS. 2 and 3. FIG. 2 is a circuit diagram of a pixel transistor for amplification, and FIG. 3 is a sectional view of the amplification pixel transistor. The pixel activation scheme will be described with reference to FIGS. 2 and 3. As shown in these drawings, the amplification pixel transistor, denoted by reference numeral 106, is formed on a semiconductor substrate 110. A gate electrode 112 is formed on the semiconductor substrate 110, and N+ diffusion regions 113a and 113b are formed on the semiconductor substrate 110 at opposite sides of the gate electrode 112, respectively. P+ diffusion regions 114a and 114b are formed on the semiconductor substrate 110 around the N+ diffusion regions 113a and 113b, respectively, to connect the gate electrode 112 with the semiconductor substrate 110. The gate electrode 112 is connected with the semiconductor substrate 110 via the P+ diffusion regions 114a and 114b. The N+ diffusion region 113a, which is one terminal of the amplification pixel transistor 106, is grounded. The N+ diffusion region 113b, which is the other terminal of the amplification pixel transistor 106, is connected to the transfer transistor 101.

However, as shown in FIGS. 2 and 3, when the pixel is activated when the pixel circuit is inappropriately configured in a two-dimensional array, the operation of the image sensor is greatly influenced by a variation in capacitor value or output resistor value.

SUMMARY OF THE INVENTION

Accordingly, the present invention is directed to a CMOS image sensor that substantially obviates one or more problems due to limitations and disadvantages of the related art.

An advantage of the present invention is to provide a CMOS image sensor wherein a photo-transistor capable of performing photo-sensing and active amplification is installed to improve low illumination characteristics while maintaining an existing pixel operation.

Additional features and advantages of the invention will be set forth in the description which follows, and will be apparent from the description, or may be learned by practice of the invention. The objectives and other advantages of the invention will be realized and attained by the structure and method particularly pointed out in the written description and claims hereof as well as the appended drawings.

To achieve these and other advantages and in accordance with the purpose of the present invention, as embodied and broadly described, a CMOS image sensor includes a photo-transistor for performing a photo-sensing and amplification function, a reset transistor connected to the photo-transistor, the reset transistor performing a reset function, a drive transistor for acting as a source follower buffer amplifier in response to an output signal from the photo-transistor, and a switching transistor connected to the drive transistor, the switching transistor performing an addressing function.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiment(s) of the invention and together with the description serve to explain the principle of the invention. In the drawings.

DETAILED DESCRIPTION OF THE INVENTION

Reference will now be made in detail to exemplary embodiments of the present invention, examples of which are illustrated in the accompanying drawings. Wherever possible, the same reference numbers will be used throughout the drawings to refer to the same or similar parts.

Figure 1:
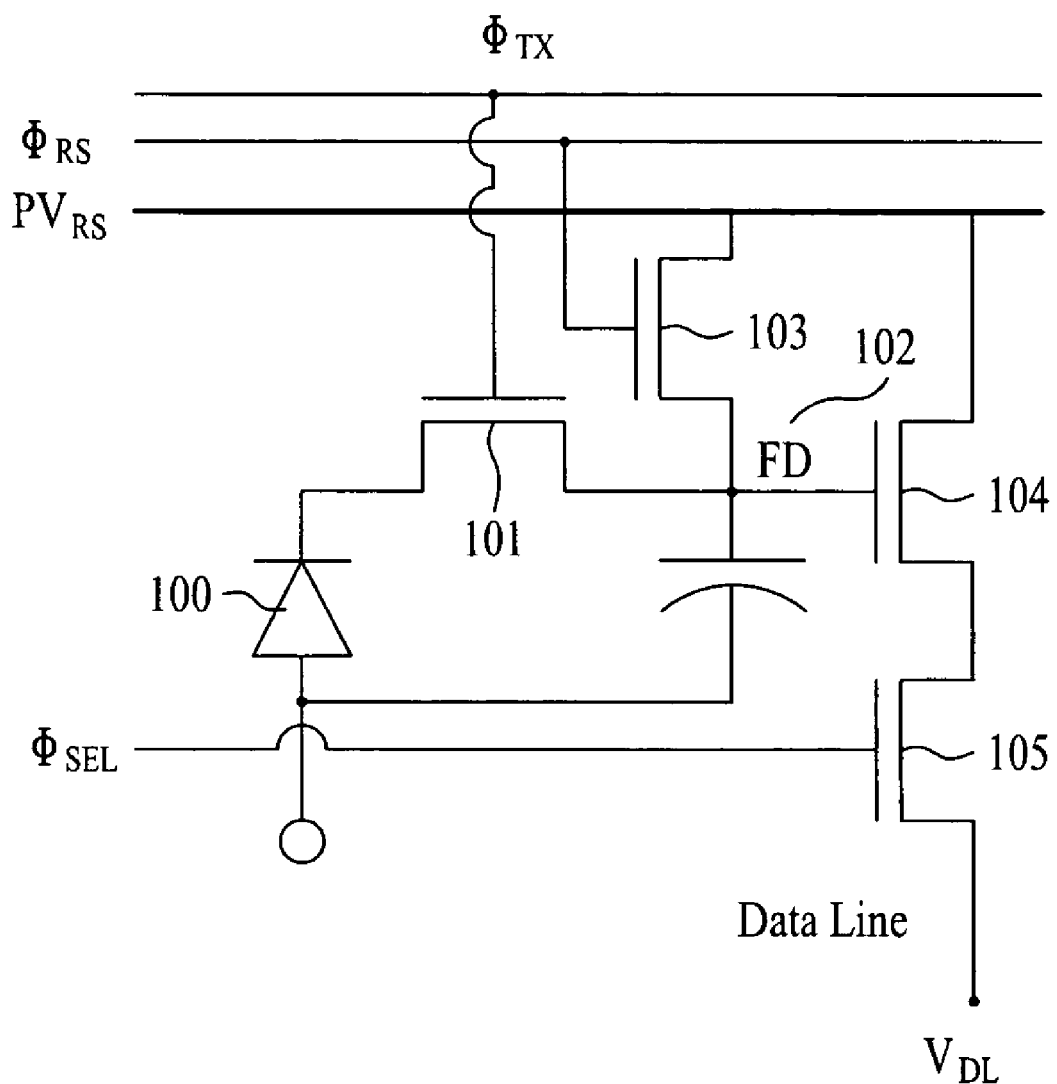
FIG. 1 is a circuit diagram of a unit pixel of a related art CMOS image sensor having four transistors.
Figure 2:
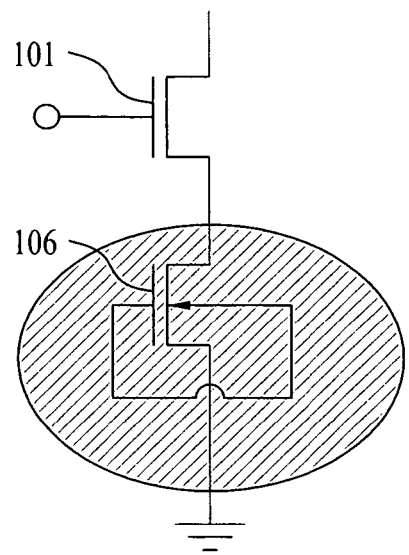
FIG. 2 is a circuit diagram of a pixel transistor for amplification of the related art CMOS image sensor.
Figure 3:
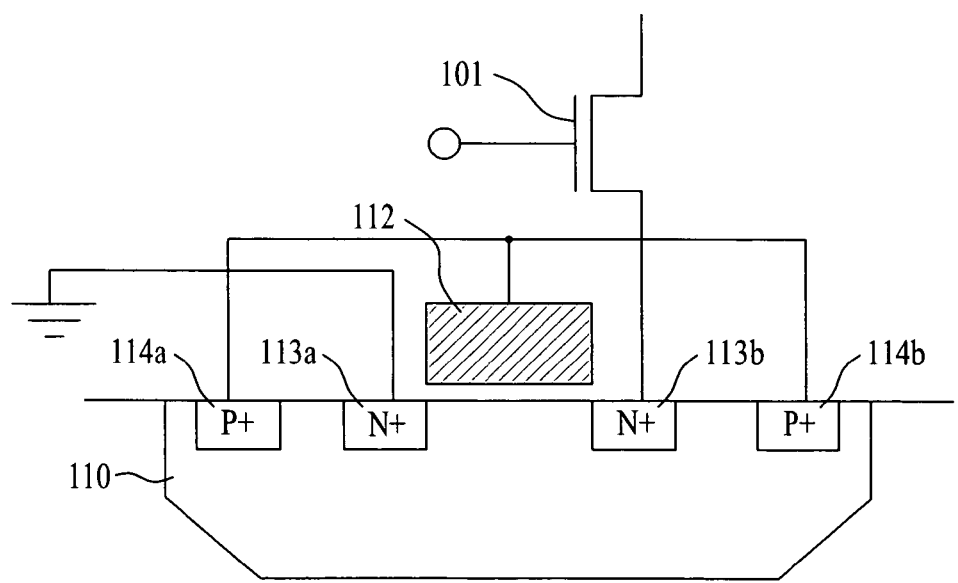
FIG. 3 is a sectional view of the amplification pixel transistor of the related art CMOS image sensor.
Figure 4:
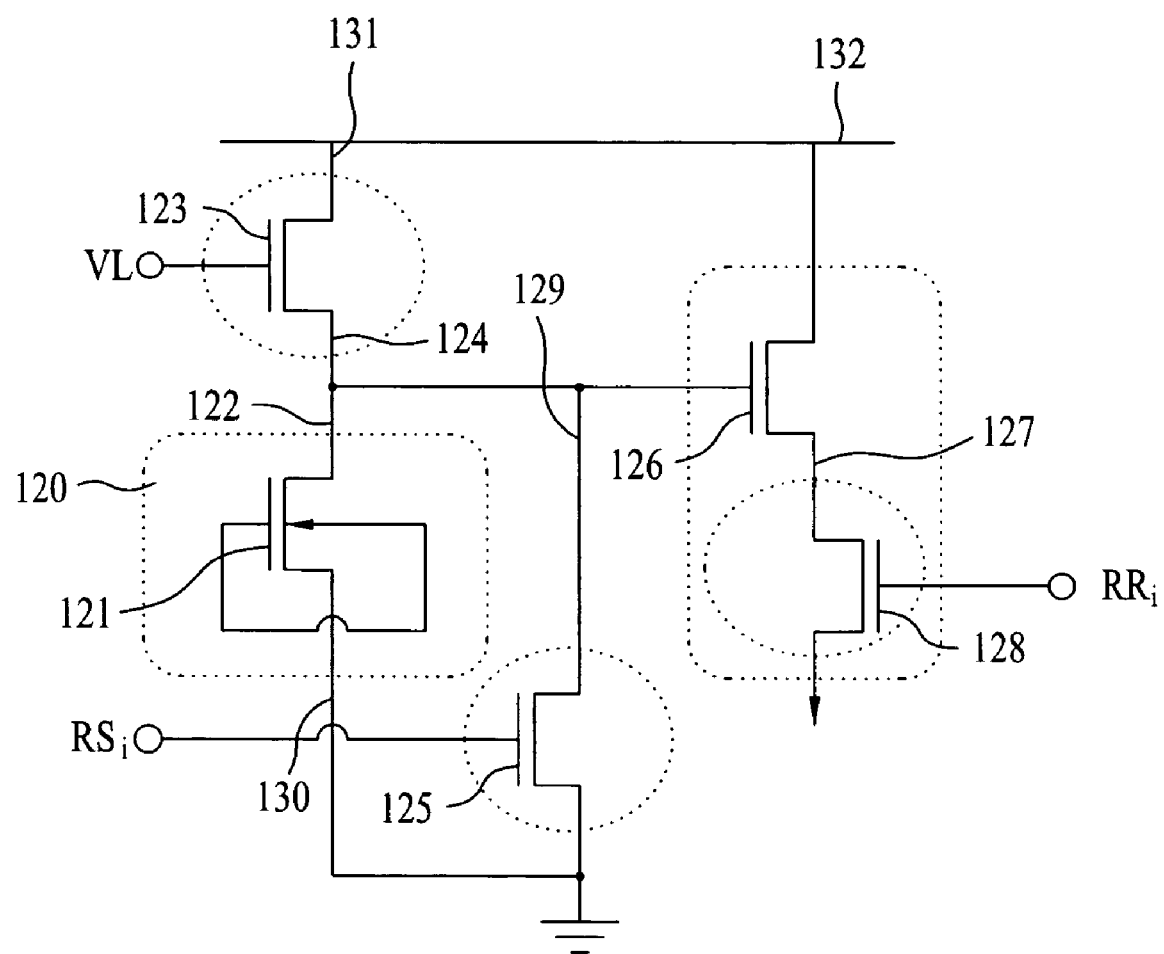
FIG. 4 is a circuit diagram of a unit pixel of a CMOS image sensor according to an exemplary embodiment of the present invention.

FIG. 4 is a circuit diagram of a unit pixel of a CMOS image sensor according to an exemplary embodiment of the present invention. As shown in this drawing, the CMOS image sensor according to this exemplary embodiment includes a photo-transistor 121 formed in a well 120 that may perform photo-sensing and amplification, and a load transistor 123 connected to one terminal 122 of the photo-transistor 121 that may receive a VL signal at its gate and may control the amplification of the photo-transistor 121 in response to the received VL signal. The CMOS image sensor also includes a reset transistor 125, connected in common to one terminal 124 of the load transistor 123 and one terminal 122 of the photo-transistor 121, that may receive an $RS_i$ signal at its gate and may perform a reset function in response to the received $RS_i$ signal. The CMOS image sensor also includes a drive transistor 126 that may receive a signal from one terminal 122 of the photo-transistor 121 at its gate and may act as a source follower buffer amplifier in response to the received signal, and a switching transistor 128 connected to one terminal 127 of the drive transistor 126 that may perform an addressing function in response to a signal $RR_i$ inputted to its gate.

As shown in FIG. 4, one terminal 122 of the photo-transistor 121 may be connected in common to one terminal 124 of the load transistor 123, one terminal 129 of the reset transistor 125 and the gate of the drive transistor 126, and the other terminal 130 of the photo-transistor 121 is grounded. One terminal 124 of the load transistor 123 may be connected in common to one terminal 122 of the photo-transistor 121, one terminal 129 of the reset transistor 125 and the gate of the drive transistor 126, and the other terminal 131 of the load transistor 123 is connected to a supply voltage terminal 132.

The photo-transistor 121, which performs photo-sensing and amplification, is isolated from the load transistor 123, reset transistor 125, drive transistor 126 and switching transistor 128, and the gate electrode of the photo-transistor 121 is electrically connected with the well 120.

Figure 5:
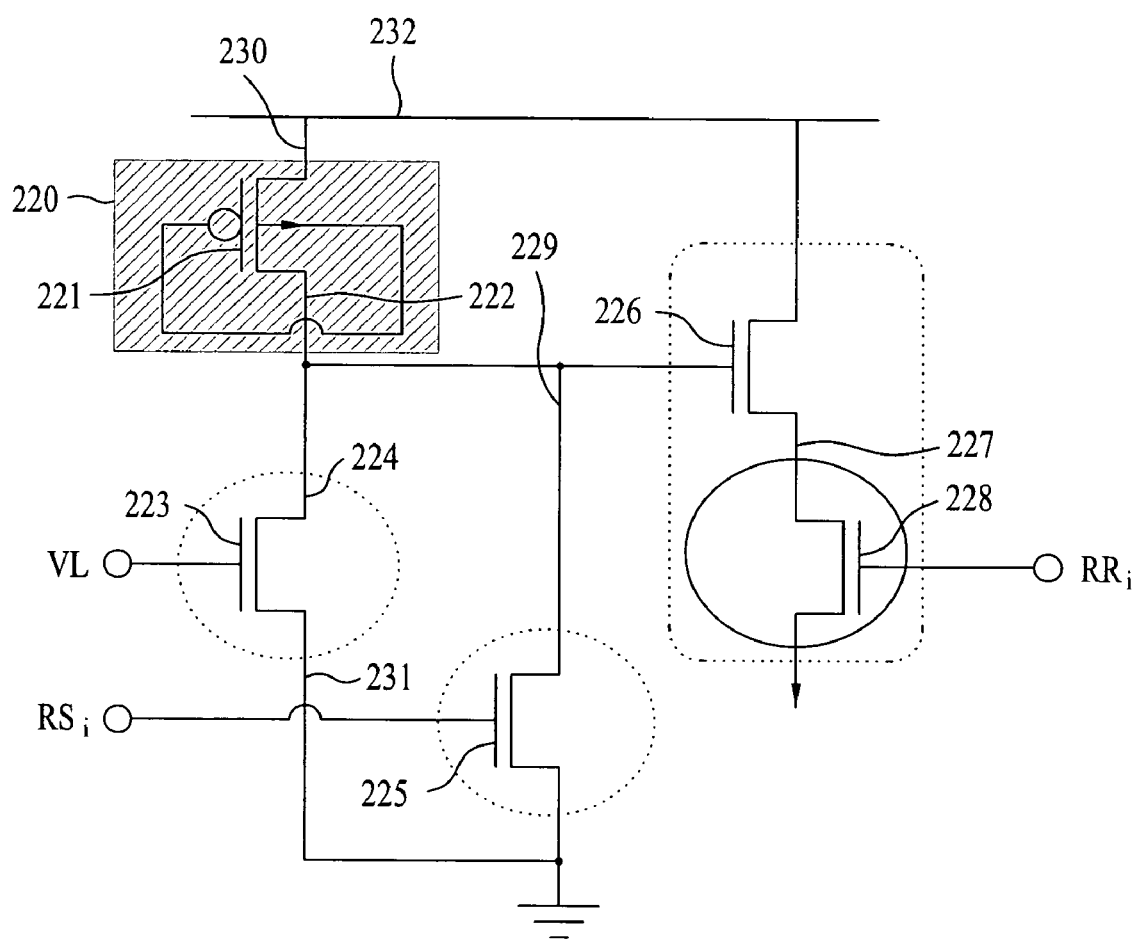
FIG. 5 is a circuit diagram of a unit pixel of a CMOS image sensor according to another exemplary embodiment of the present invention.

FIG. 5 is a circuit diagram of a unit pixel of a CMOS image sensor according to another exemplary embodiment of the present invention. As shown in this drawing, the CMOS image sensor according to this exemplary embodiment includes a photo-transistor 221 of a PMOS type formed in a well 220 that may perform photo-sensing and amplification, and a load transistor 223 connected to one terminal 222 of the photo-transistor 221 that may receive a VL signal at its gate and may control the amplification of the photo-transistor 221 in response to the received VL signal. The CMOS image sensor also includes a reset transistor 225 connected in common to one terminal 224 of the load transistor 223 and one terminal 222 of the photo-transistor 221 that may receive an $RS_i$ signal at its gate and may perform a reset function in response to the received $RS_i$ signal. The CMOS transistor also includes a drive transistor 226 that may receive a signal from one terminal 222 of the photo-transistor 221 at its gate and may act as a source follower buffer amplifier in response to the received signal, and a switching transistor 228 connected to one terminal 227 of the drive transistor 226 and adapted for performing an addressing function in response to a signal $RR_i$ inputted to its gate.

As shown in FIG. 5, one terminal 222 of the photo-transistor 221 is connected in common to one terminal 224 of the load transistor 223, one terminal 229 of the reset transistor 225 and the gate of the drive transistor 226, and the other terminal 230 of the photo-transistor 221 is connected to a supply voltage terminal 232. One terminal 224 of the load transistor 223 is connected in common to one terminal 222 of the photo-transistor 221, one terminal 229 of the reset transistor 225 and the gate of the drive transistor 226, and the other terminal 231 of the load transistor 223 is grounded.

The photo-transistor 221, which performs photo-sensing and amplification, is isolated from the load transistor 223, reset transistor 225, drive transistor 226 and switching transistor 228, and the gate electrode of the photo-transistor 221 is electrically connected with the well 220.

The CMOS image sensor according to the present invention includes a photo-transistor that may perform photo-sensing and active amplification. The photo-transistor may be installed to enable shooting in low illumination conditions while maintaining an existing pixel operation.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A complementary metal oxide silicon (CMOS) image sensor comprising:

a photo-transistor for performing a photo-sensing and amplification function;

a reset transistor connected to the photo-transistor, the reset transistor performing a reset function;

a drive transistor for acting as a source follower buffer amplifier in response to an output signal from the photo-transistor;

a switching transistor connected to the drive transistor, the switching transistor performing an addressing function; and a load transistor connected to the photo-transistor for controlling the amplification function of the photo-transistor;

wherein the load transistor has one terminal connected in common to one terminal of the photo-transistor, one terminal of the reset transistor and a gate of the drive transistor, and the other terminal connected to a supply voltage terminal.

2. The CMOS image sensor of claim 1, wherein the photo-transistor has one terminal connected to a ground terminal, and the other terminal connected in common to one terminal of the load transistor, one terminal of the reset transistor and a gate of the drive transistor.

3. The CMOS image sensor of claim 1, wherein the photo-transistor is formed in a well, the well being isolated from the reset transistor, drive transistor and switching transistor.

4. The CMOS image sensor of claim 3, wherein the photo-transistor has a gate electrode electrically connected with the well.

5. The CMOS image sensor of claim 1, wherein the photo-transistor is a PMOS type photo-transistor.

6. The CMOS image sensor of claim 5, wherein the photo-transistor has one terminal connected to a supply voltage terminal, and the other terminal connected in common to one terminal of the load transistor, one terminal of the reset transistor and a gate of the drive transistor.

* * * * *